(12) United States Patent  (10) Patent No.: US 7,525,841 B2
Aritome  (45) Date of Patent: Apr. 28, 2009

(54) PROGRAMMING METHOD FOR NAND FLASH

(75) Inventor: Seiichi Aritome, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 218 days.

(21) Appl. No.: 11/452,698

(22) Filed: Jun. 14, 2006

(65) Prior Publication Data

US 2007/0291542 A1    Dec. 20, 2007

(51) Int. Cl.
  *G11C 16/04* (2006.01)
(52) U.S. Cl. .............................. 365/185.17; 365/185.18; 365/185.03
(58) Field of Classification Search ............ 365/185.17, 365/185.18, 185.03
  See application file for complete search history.

(56) References Cited

U.S. PATENT DOCUMENTS

| | | | |
|---|---|---|---|
| 5,293,337 A | 3/1994 | Aritome et al. | |
| 5,680,347 A | 10/1997 | Takeuchi et al. | |
| 5,774,397 A | 6/1998 | Endoh et al. | |
| 5,949,101 A | 9/1999 | Aritome | |
| 5,978,265 A | 11/1999 | Kirisawa et al. | |
| 6,049,482 A | 4/2000 | Aritome et al. | |
| 6,115,287 A | 9/2000 | Shimizu et al. | |
| 6,172,911 B1 | 1/2001 | Tanaka et al. | |
| 6,191,975 B1 | 2/2001 | Shimizu et al. | |
| 6,310,374 B1 | 10/2001 | Satoh et al. | |
| 6,614,688 B2* | 9/2003 | Jeong et al. ............ | 365/185.18 |
| 6,930,536 B2 | 8/2005 | Nazarian et al. | |
| 6,930,921 B2* | 8/2005 | Matsunaga et al. ..... | 365/185.18 |
| 6,977,842 B2 | 12/2005 | Nazarian | |
| 7,099,193 B2* | 8/2006 | Futatsuyama .......... | 365/185.17 |
| 7,099,200 B2* | 8/2006 | Sakui .................... | 365/185.33 |
| 7,161,833 B2* | 1/2007 | Hemink ................. | 365/185.18 |
| 7,170,793 B2* | 1/2007 | Guterman ............. | 365/185.28 |
| 7,184,309 B2* | 2/2007 | Matsunaga et al. ..... | 365/185.17 |
| 7,295,478 B2* | 11/2007 | Wan et al. .................... | 365/195 |
| 7,355,889 B2* | 4/2008 | Hemink et al. ......... | 365/185.17 |
| 2005/0185466 A1 | 8/2005 | Prall | |
| 2006/0044908 A1 | 3/2006 | Ha | |
| 2007/0236992 A1* | 10/2007 | Oowada ................. | 365/185.02 |

* cited by examiner

*Primary Examiner*—Huan Hoang
(74) *Attorney, Agent, or Firm*—Leffert Jay & Polglaze, P.A.

(57) ABSTRACT

A NAND architecture non-volatile memory device and programming process is described that programs the various cells of strings of non-volatile memory cells utilizing a drain-side self boost, modified drain-side self boost or local self boost process that increases the pass voltage (Vpass_high) on a word line on the source line side of a memory cells selected for programming to boost the voltage on the source of the adjacent blocking cell of the string. This drives the adjacent blocking cell further into cutoff and increases boosting by decreasing channel leakage to the source line during programming.

30 Claims, 9 Drawing Sheets

US 7,525,841 B2

PROGRAMMING METHOD FOR NAND FLASH

TECHNICAL FIELD OF THE INVENTION

The present invention relates generally to memory devices and in particular the present invention relates to EEPROM and Flash memory devices.

BACKGROUND OF THE INVENTION

Memory devices are typically provided as internal storage areas in the computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM, which permits you only to read data. Most RAM is volatile, which means that it requires a steady flow of electricity to maintain its contents. As soon as the power is turned off, whatever data was in RAM is lost.

Computers almost always contain a small amount of read-only memory (ROM) that holds instructions for starting up the computer. Memory devices that do not lose the data content of their memory cells when power is removed are generally referred to as non-volatile memories. An EEPROM (electrically erasable programmable read-only memory) is a special type non-volatile ROM that can be erased by exposing it to an electrical charge. EEPROM comprise a large number of memory cells having electrically isolated gates (floating gates). Data is stored in the floating gate field effect transistor (FET) memory cells in the form of charge on the floating gates. The floating gate is typically made of doped polysilicon, or non-conductive charge trapping layer (a floating node), such as nitride (as would be utilized in a silicon-oxide-nitride-oxide-silicon or SONOS gate-insulator stack), is disposed over the channel region and is electrically isolated from the other cell elements by a dielectric material, typically an oxide. Charge is transported to or removed from the floating gate or trapping layer by specialized programming and erase operations, respectively, altering the threshold voltage of the device.

Yet another type of non-volatile memory is a Flash memory. A typical Flash memory comprises a memory array, which includes a large number of floating gate memory cells. The cells are usually grouped into sections called "erase blocks." Each of the cells within an erase block can be electrically programmed by tunneling charges to its individual floating gate/node. Unlike programming operations, however, erase operations in Flash memories typically erase the memory cells in bulk erase operations, wherein all floating gate/node memory cells in a selected erase block are erased in a single operation. It is noted that in recent non-volatile memory devices multiple bits have been stored in a single cell by utilizing multiple threshold levels or a non-conductive charge trapping layer with the storing of data trapped in a charge near each of the sources/drains of the memory cell FET.

A NAND architecture array of a EEPROM or Flash also arranges its array of non-volatile memory cells in a matrix of rows and columns, as a conventional NOR array does, so that the gates of each non-volatile memory cell of the array are coupled by rows to word lines (WLs). However, unlike NOR, each memory cell is not directly coupled to a source line and a column bit line. Instead, the memory cells of the array are arranged together in strings, typically of 8, 16, 32, or more each, where the memory cells in the string are coupled together in series, source to drain, between a common source line and a column bit line. It is noted that other non-volatile memory array architectures exist, including, but not limited to AND arrays, OR arrays, and virtual ground arrays.

A problem in modern NAND architecture Flash memory devices is that, as device sizes and features are further reduced with improved processing, the separation between adjacent cells in the array is reduced (also known as a decreased memory cell "array pitch"). This reduced cell separation can allow for leakage from the drain to the source through the string channel during programming of memory cells close to the ends of the string when high voltage differentials exist between adjacent memory cells.

For the reasons stated above, and for other reasons stated below which will become apparent to those skilled in the art upon reading and understanding the present specification, there is a need in the art for alternative methods of programming and accessing NAND architecture Flash memory arrays.

DETAILED DESCRIPTION

Figure 1:
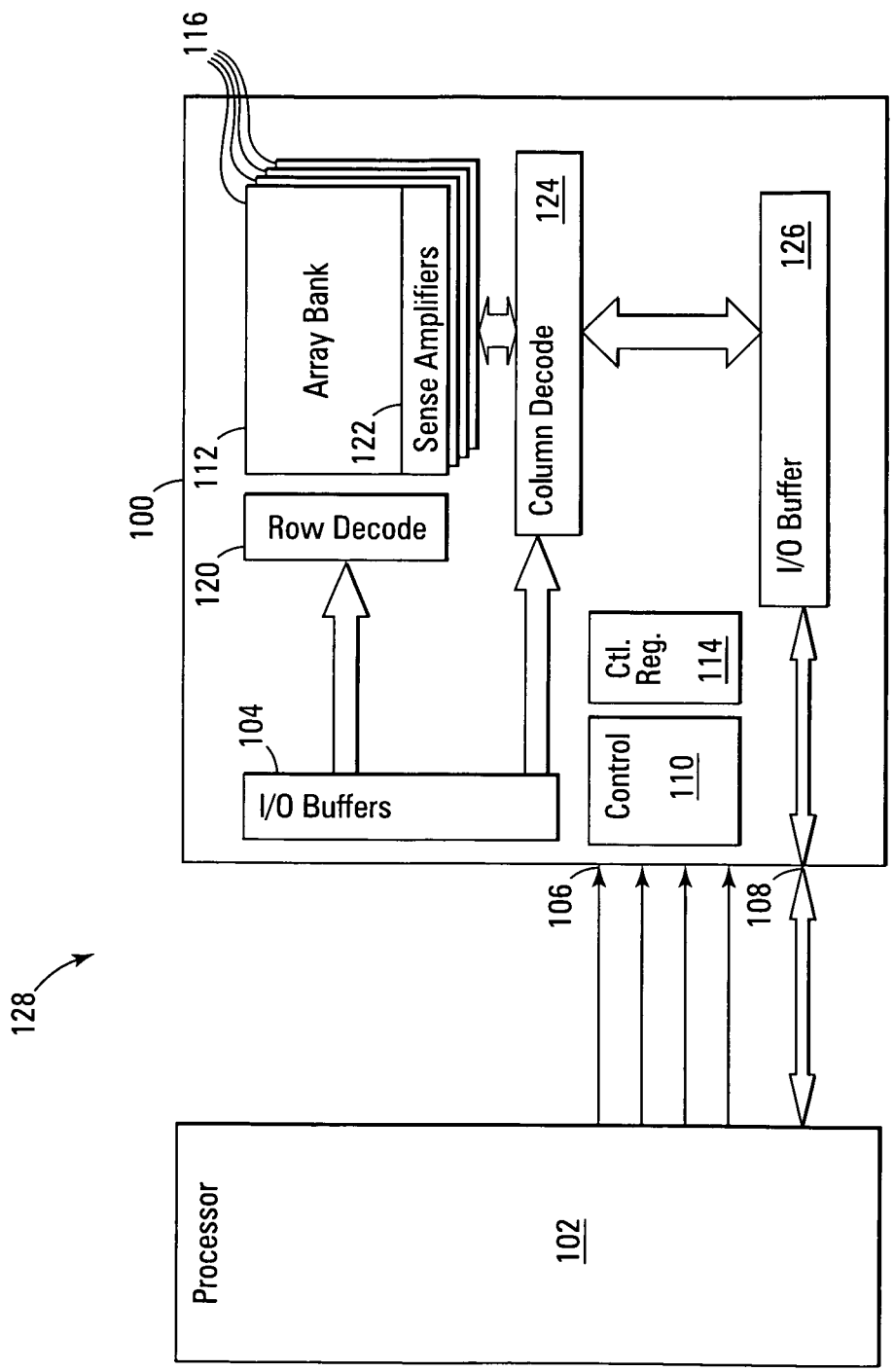
FIG. 1 is a simplified block diagram of a system containing a non-volatile memory device in accordance with an embodiment of the present invention.

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the claims.

Embodiments of the present invention include NAND architecture memory devices and arrays that program the various cells of strings of non-volatile memory cells utilizing a drain-side self boost, modified drain-side self boost or local self boost process, wherein a word line on the source line side of a memory cells selected for programming has an increased pass voltage applied to it to boost the coupled channel voltage on the source of the next adjacent cell of the string to enhance the cutoff state of the adjacent cell and decrease leakage to the source line from the boosted channel and drain. This is advantageous in particular when memory cells close to the source line are being programmed.

In one embodiment of the present invention, a NAND architecture non-volatile memory device and programming process is described that programs the various cells of strings of non-volatile memory cells utilizing a drain-side self boost process that increases the pass voltage (Vpass_high) on a word line adjacent to one or more "blocking" memory cells on the source line side of a memory cell selected for programming. The blocking cells are directly adjacent the memory cell selected for programming and have a ground potential or Vss is placed on their word lines to place them in cutoff. In the programming operation, a programming voltage is then coupled to the word line of the selected cell, and Vpass is placed on the unselected word lines between the selected memory cell and the bit line to boost the channel under the unselected cells and couple the selected memory cell to the bit line for program or program-inhibit. The increased pass voltage (Vpass_high) on the unselected memory cell adjacent to the blocking memory cell(s) boosts the voltage coupled to the source of the blocking memory cell of the string it is coupled to and drives the blocking cell further into cutoff, decreasing channel and bit line leakage to the source line during programming.

In another embodiment, a NAND architecture programming process is described that programs the various cells of strings of non-volatile memory cells utilizing a modified drain-side self boost process that increases the pass voltage (Vpass_high) on a word line adjacent to one or more "blocking" memory cells on the source line side of a memory cell selected for programming. The blocking cells are adjacent the memory cell selected for programming and have a ground potential or Vss is placed on their word lines to place them in cutoff. In the modified drain-side self boost programming operation, Vcc or Vdd is coupled to the word line adjacent to the selected word line/memory cell, a programming voltage is coupled to the word line of the selected cell, and Vpass placed on the unselected word lines between the selected memory cell and the bit line to boost the channel under the unselected cells and couple the selected memory cell to the bit line for programming. In yet another embodiment, a NAND architecture programming process is described that programs the various cells of strings of non-volatile memory cells utilizing a local self boost process that increases the pass voltage (Vpass_high) on a word line adjacent to one or more "blocking" memory cells on the source line side of a memory cell selected for programming.

In a further embodiment of the present invention, a NAND architecture non-volatile memory device and programming process is described that programs the various cells of strings of non-volatile memory cells utilizing a drain-side self boost process that increases the pass voltage (Vpass_WL0_high) on the word line closest to the source line (WL0). In addition, in this programming process, a ground potential or Vss is placed on the word lines of memory cells between WL0 and the word line/memory cell selected for programming, a programming voltage is coupled to the word line of the selected cell, and Vpass is placed on the unselected word lines between the selected memory cell and the bit line to boost the channel under the unselected cells and couple the selected memory cell to the bit line for program or program-inhibit. The increased WL0 pass voltage (Vpass_WL0_high) boosts the voltage coupled to the source of the memory cell adjacent to the WL0/last memory cell of the string and drives the adjacent cell further into cutoff, decreasing channel and bit line leakage to the source line during programming. In another embodiment, a NAND architecture programming process is described that programs the various cells of strings of non-volatile memory cells utilizing a modified drain-side self boost process that increases the pass voltage (Vpass_WL0_high) on the word line closest to the source line (WL0). A ground potential or Vss is placed on the word lines of memory cells between WL0 and the word line adjacent to the word line/memory cell selected for programming, Vcc or Vdd is coupled to the word line adjacent to the selected word line/memory cell, a programming voltage is coupled to the word line of the selected cell, and Vpass placed on the unselected word lines between the selected memory cell and the bit line to boost the channel under the unselected cells and couple the selected memory cell to the bit line for programming. In yet another embodiment, a NAND architecture programming process is described that programs the various cells of strings of non-volatile memory cells utilizing a local self boost process that increases the pass voltage (Vpass_WL0_high) on the word line closest to the source line (WL0).

It is noted, while embodiments of the present invention are described in relation to drain-side self boosting programming processes, that source-side self boost and virtual ground embodiments of the present invention are also possible and will be apparent to those skilled in the art with the benefit of the present invention. It is also noted that embodiments of the present invention include all non-volatile memory cell devices and memories that trap charge in an electrically isolated region (such as charge trapping/floating node memory cells) and are not limited to floating gate memory cell arrays or memory devices.

FIG. 1 details a simplified diagram of a system 128 incorporating a non-volatile memory device 100 of an embodiment of the present invention connected to a host 102, which is typically a processing device or memory controller. The non-volatile memory 100, such as a Flash memory device, has a control interface 106 and an address/data interface 108 that are each connected to the processing device 102 to allow memory read and write accesses. It is noted that in alternative embodiments, the address/data interface 108 can be divided into separate interfaces. Internal to the non-volatile memory device a control state machine/control circuit 110 directs the internal operation; managing the non-volatile memory array 112 and updating RAM control registers and erase block management registers 114. The RAM control registers and tables 114 are utilized by the control state machine 110 during operation of the non-volatile memory 100. The non-volatile memory array 112 contains a sequence of memory banks or segments 116, each bank 116 is organized logically into a series of erase blocks (not shown). Memory access addresses are received on the address/data interface 108 of the non-volatile memory 100 and divided into a row and column address portions. On a read access, the row address is latched by the interface I/O buffer 104 and decoded by row decode circuit 120, which selects and activates a row page (not shown) of memory cells and the other memory cells in their associated strings across a selected memory bank. The bit values encoded in the output of the selected row of memory cells are connected from a local bit line/string (not shown) to a global bit line (not shown) and detected by sense amplifiers 122 associated with the memory bank. The sense amplifiers 122 also typically include a data cache and write data latch circuits (not shown). The column address of the access is also latched by the interface I/O buffer 104 and decoded by the column decode circuit 124. The output of the column decode circuit selects the desired column data from the sense amplifier outputs and connected to the data buffer 126 for transfer from the memory device through the address/data interface 108. On a write access the row decode circuit 120 selects the row page and column decode circuit selects write sense amplifiers 122. Data values to be written are connected from the data buffer 126 to the data cache and then to the write data latches of the write sense amplifiers 122 selected by the column decode circuit 124 and written to the selected non-volatile memory cells (not shown) of the memory array 112. The written cells are then reselected by the row and column decode circuits 120, 124 and sense amplifiers 122 so that they can be read to verify that the correct values have been programmed into the selected memory cells. It is noted that in one embodiment of the present invention, the column decode 124 may be optionally placed between the memory array 112 and the sense amplifiers 122.

As stated above, two common types of non-volatile or Flash memory array architectures are the "NAND" and "NOR" architectures, so called for the resemblance which the basic memory cell configuration of each architecture has to a basic NAND or NOR gate circuit, respectively. In the NAND array architecture, the memory cells of the memory array are arranged in a matrix similar to conventional RAM or ROM, such that the gates of each memory cell of the array are coupled by rows to word lines (WL). However each memory cell is not directly coupled to a source line (SL) and a column bit line (BL), as would be the case in the NOR architecture style. Instead, the memory cells of the array are arranged together in strings, typically of 8, 16, 32, or more each, where the memory cells in the string are coupled together in series, source to drain, between a common source line and a column bit line. This allows a NAND array architecture to have a higher memory cell density than a comparable NOR array, but with the cost of a generally slower access rate and programming complexity.

Figure 2:
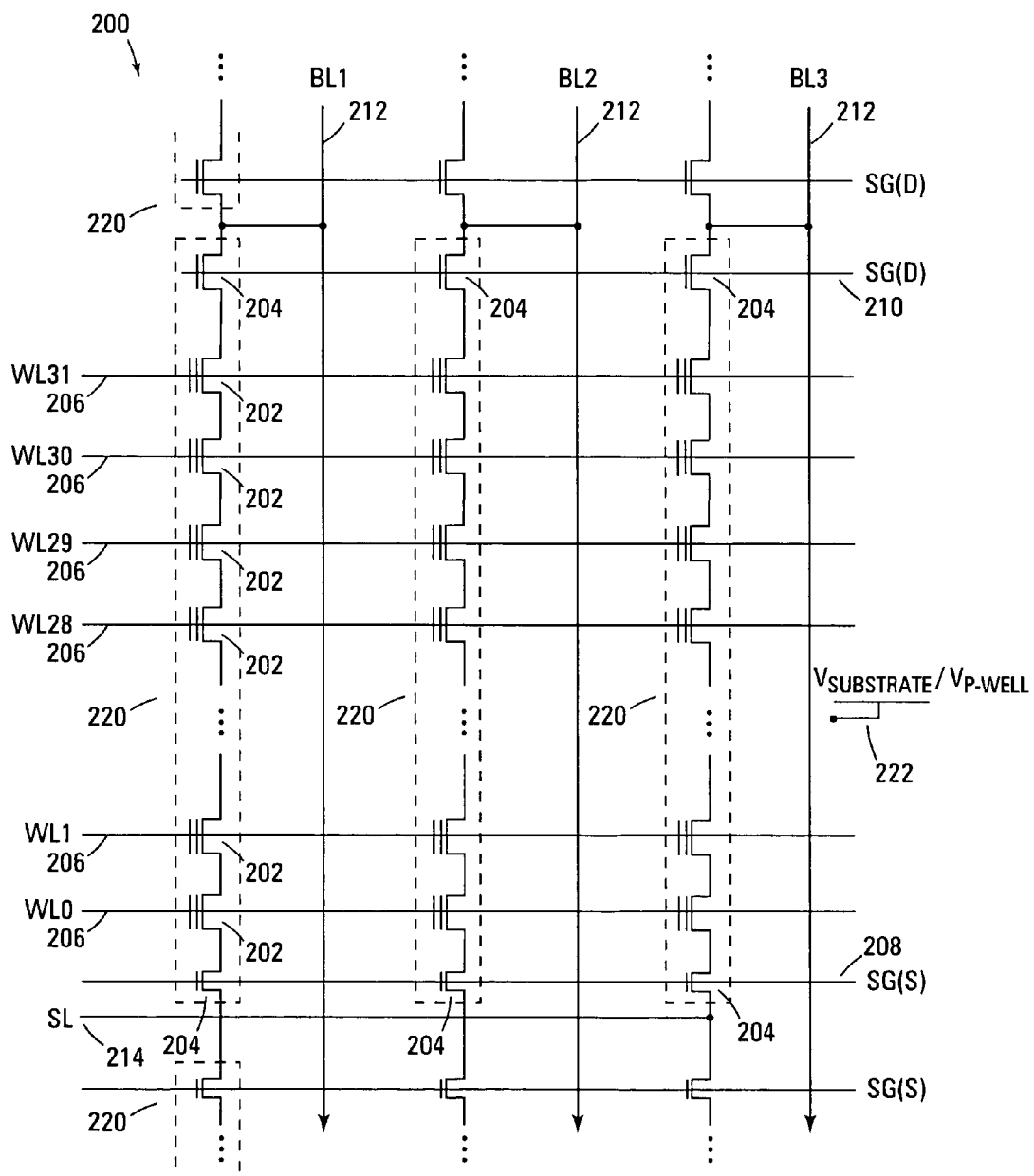
FIG. 2 is a simplified block diagram of a NAND architecture Flash memory array in accordance with an embodiment of the present invention.

FIG. 2 shows a schematic of a simplified NAND architecture floating node or trapping layer memory array 200 of a NAND Flash memory device of an embodiment of the present invention. It is noted that the memory array 200 of FIG. 2 is for illustrative purposes and should not be taken as limiting and that other NAND memory array embodiments of the present invention are possible and will be apparent to those skilled in the art with the benefit of the present disclosure. In FIG. 2, a series of NAND memory strings 220 are arranged in an array 200 and coupled to bit lines 212 and source lines 214. In each NAND memory string 220, a series of floating gate or floating node memory cells 202 of embodiments of the present invention are coupled together source to drain to form the NAND string 220 (typically having 8, 16, 32, or more cells). As described above, each floating gate/node memory cell FET 202 has a gate-insulator stack formed over the channel region. To further enable operation, in one embodiment of the present invention, one or more NAND architecture memory strings 220 of the memory are shown formed in an isolation trench, allowing the substrate of each isolation trench to be individually biased for programming and erasure. The word lines 206 couple across the NAND strings 220, coupling the control gates of adjacent memory cells 202 enabling a single memory cell 202 in each memory string 220 to be selected. In each NAND memory string 220, impurity (N+ typically) doped regions are formed between each gate insulator stack to form the source and drain regions of the adjacent memory cells 202, which additionally operate as connectors to couple the cells of the NAND string 220 together. In one embodiment of the present invention, the N+ doped regions are omitted and a single channel region is formed under the NAND memory string 220, coupling the individual memory cells 202. Each NAND memory string 220 is coupled to select gates 204 that are formed at either end of each NAND string 220 and selectively couple opposite ends of each NAND string 220 to a bit line 212 and a source line 214. The select gates 204 are each coupled to gate select lines, select gate drain {SG(D)} 210 and select gate source {SG(S)} 208, that control the coupling of the NAND strings to the bit lines 212 and source lines 214, respectively, through the select gates 204. In FIG. 2, the substrate connection 222 is shown coupled to each NAND string 220, allowing the memory cells 202 of each NAND string 220 to be biased from the substrate.

A NAND architecture floating gate or floating node memory array is accessed by a row decoder activating a row of memory cells by selecting the word select line coupled to their gates. In addition, the word lines coupled to the gates of the unselected memory cells of each string are also driven. However, the unselected memory cells of each string are typically driven by a higher gate voltage so as to operate them as pass transistors and allowing them to pass current in a manner that is unrestricted by their stored data values. Current then flows from the source line to the column bit line through each floating gate/node memory cell of the series coupled string, restricted only by the memory cells of each string that are selected to be read. This places the current encoded stored data values of the row of selected memory cells on the column bit lines. A column page of bit lines is selected and sensed, and then individual data words are selected from the sensed data words from the column page and communicated from the memory device.

Common programming technique for Flash/EEPROM memories programs a bit or row (commonly referred to as a page) of the memory by applying a programming voltage or series of programming voltage pulses to the control gates of the selected memory cells and then programming or inhibiting the selected memory cells to either programmed threshold level (typically to set at logical "0" by the injection of charge to the floating gate or floating node of a memory cell) or inhibited level (the cell is not programmed and left in its original state, usually intended to leave the cell erased and set at logical "1") by coupling the channels of the memory cells to either a program or inhibit voltage. It is noted that some erase operations also include program cycles. These erasure program cycles are typically used to preprogram the cells to a uniform programmed threshold voltage before erasure and to "heal" over-erased memory cells to a uniform erased state threshold voltage afterwards.

In typical programming operations in NAND architecture Flash/EEPROM memory arrays, a programming voltage is coupled to a word line coupled to the gate of the selected memory cell of a memory string. In addition, the word lines that are coupled to the gates of the unselected memory cells of the string are also driven by a pass voltage (Vpass) so as to operate them as pass transistors, generating a channel of carriers by capacitive coupling in the unselected memory cells and allowing them to pass current in a manner that is relatively unrestricted by their stored data values. The memory string is then coupled to a bit line or source line that has a program voltage placed upon it, through the generated channel of the string and one or both of the select gates. This applies a field that across the selected memory cell that causes carriers to tunnel from the channel to the floating gate or charge trapping layer, altering the threshold voltage level (Vt) of the selected memory cell and storing the data value. If a program-inhibit voltage placed upon the coupled bit line or source line, the applied field is not sufficient to tunnel carriers to the floating gate/node, no data value is programmed and the selected memory cell remains in the erased state.

In the example programming operation detailed above, a program voltage (such as, Vpgm=20V) is placed on the word line coupled to the control gate of the selected memory cell. A channel is generated in the string, by the application of a pass voltage (such as, Vpass=9V) to the word lines coupled to the control gates of the unselected memory cells of the string. The select gate coupling the memory string to the source line is turned off to isolate the string from the source line by the application of 0V to the source select gate control line and Vcc to the source line. The memory string is coupled to the bit line through the drain select gate by the application of Vcc to the select gate drain control line and the selected memory cell is then programmed to a logical "0" state by the application of 0V to the bit line. It is noted that the above describe programming operation is for illustrative purposes and should not be taken as limiting.

After programming the selected memory cell(s), a verify operation is then performed to confirm that the data was successfully programmed. If the programmed memory cell(s) fail verification, the program and verify cycle is repeated until the data is successfully programmed or a selected number of iterations have passed and the programming operation is deemed to have failed.

The memory cells of a NAND string are typically programmed sequentially from the source side (WL0) to the drain side (WLN, such as WL31 in a 32 cell string) of the string. In the worst case scenario, programming the last few cells (cells near WLN) of the string when all or most of the previously programmed cells are in the programmed state can become problematic because of the reduction in channel formation in a self boost programming operation caused by the stored charge on the floating gates. This, in turn, can cause issues with program disturb on the final few memory cells of the string and/or adjacent strings due to the increased voltage drop from poor channel formation. Drain-side self boost is one technique that has developed in NAND to help prevent this possibility of disturb by isolating the channel of the memory cell being programmed or inhibited from the remaining un-programmed memory cells of the string. In a drain-side self boost programming operation one or more word lines on the source line coupled side of the memory cell selected for programming and directly adjacent to it is tied to 0V or ground as blocking cells operating in cutoff mode to isolate the downstream cells of the memory string. Any other word lines on the source side of the selected memory cell that are isolated from the main channel by the blocking cells have Vpass applied to them to generate a local channel and further assist in the prevention of program disturb.

Modified drain-side self boost, modifies the drain-side self boost technique so that the word line/memory cell directly adjacent the memory cell selected for programming is coupled to an intermediate voltage, such as a supply potential, Vcc, or Vdd, with the next downstream adjacent word line/memory cells being tied to ground or 0V to act as blocking cells. This reduces the maximum voltage differential experienced between adjacent word lines to reduce stress and issues of insulator breakdown or punch through. "Local self boost" is another related technique to drain-side self boost and further isolates the programmed cell of the string by grounding one or more of the adjacent word lines on both sides of the selected word line, and ties the remainder of the unselected word lines to Vpass.

A problem with drain-side self boost, modified drain-side self boost, and local self boost programming is that leakage can occur past the blocking cells to the source line, reducing the coupled voltage boost of the channel and potentially leaking current from the bit line. This possibility for leakage is particularly an issue when the memory cells close to the source line (memory cells adjacent to the WL0/last memory cell of the string) are programmed and the voltage drops across the blocking cells are high.

As stated above, embodiments of the present invention include NAND architecture memory devices and arrays that program the various cells of strings of non-volatile memory cells utilizing a drain-side self boost, modified drain-side self boost or local self boost process, wherein a word line on the source line side of a memory cells selected for programming and adjacent to the blocking memory cell(s) has an increased pass voltage applied to it to boost the coupled channel voltage applied to the source of the adjacent blocking cell of the string, enhancing the cutoff state of adjacent cell and decreasing leakage to the source line from the boosted channel and drain. In particular, embodiments of the present invention are specifically suited to programming strings of memory cells in non-volatile NAND architecture memory arrays and memory devices when memory cells closest to the source line are being programmed.

FIGS. 3A to 3F illustrate a typical NAND architecture memory array and string programming operations of an embodiment of the present invention utilizing an increased Vpass word line voltage for the word line of the adjacent memory cell on the source line side the last blocking cell, such as WL0, to reduce leakage and enhance cutoff in the blocking cells. It is noted that the NAND programming operations described in FIGS. 3A to 3F are for illustrative purposes and should not be taken as limiting.

Figure 3A:
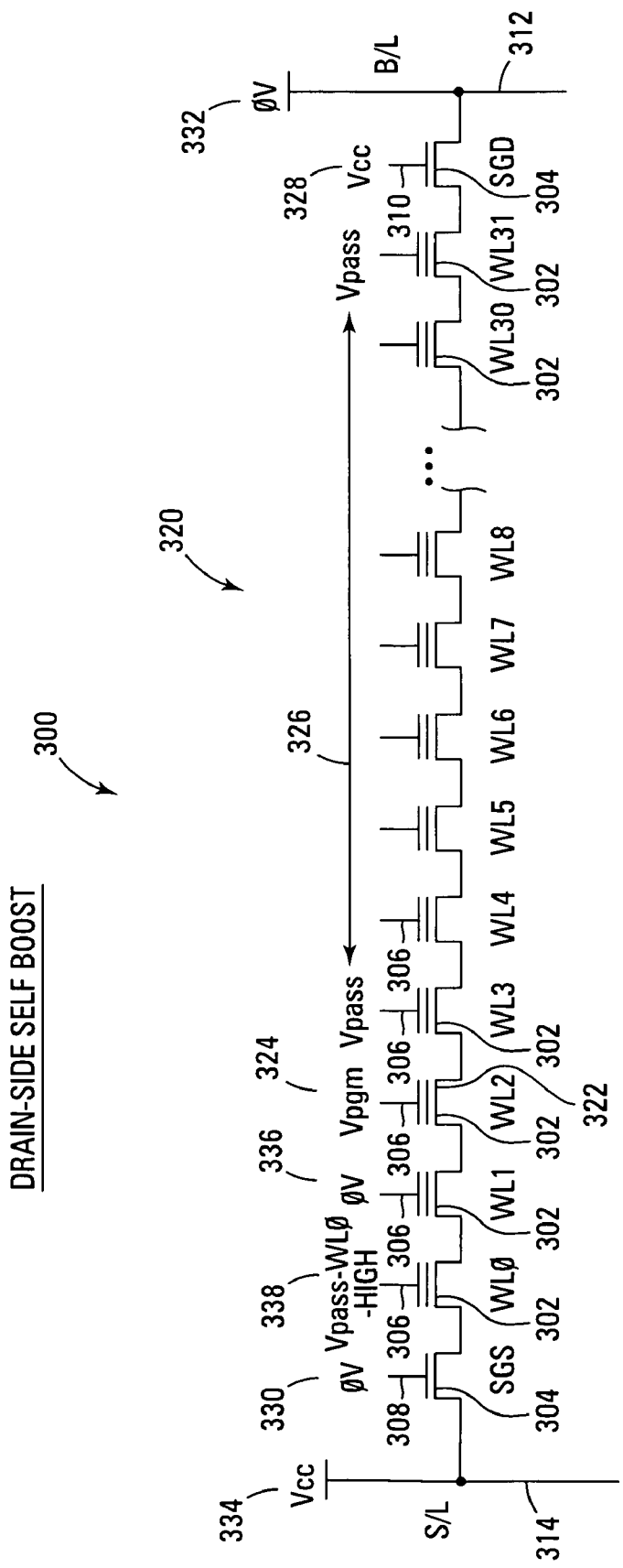
FIGS. 3A-3F show diagrams detailing program word line voltages in accordance with embodiments of the present invention.

FIG. 3A illustrates a NAND architecture memory 300 embodiment of the present invention that applies an elevated pass voltage during a drain-side self boost programming operation. In FIG. 3A, a memory cell 322 coupled to WL2 306 of the memory string 320 has been selected for programming and an elevated programming voltage 324 is applied to it. The memory cell coupled to WL1 acts as the blocking cell for the drain-side self boost and has a cutoff voltage (such as, ground or 0V) 336 applied to its gate. In addition, an elevated pass voltage (Vpass_WL0_high) 338 is applied to WL0 during the programming operation to boost the voltage at the source of the blocking cell of WL1 and enhance cutoff in it and in the source select gate 304 coupled to the source line 314. The word lines 306 that are coupled to the gates of the unselected memory cells 302 of the string 320 towards the bit line 312 are driven by a pass voltage (Vpass) 326 so as to operate them as pass transistors, generating a channel of carriers by capacitive coupling in the unselected memory cells 302 and allowing them to pass current in a manner that is relatively unrestricted by their threshold voltage values. The memory string 320 is then coupled to a bit line 312 that has a program voltage placed upon it, through the generated drain-side channel of the string 320 and drain select gate 304. This applies a field across the selected memory cell 322 that causes carriers to tunnel from the channel to the floating gate or charge trapping layer, altering the threshold voltage level (Vt) of the selected memory cell 322 and storing the data value. If a program-inhibit voltage is placed upon the coupled bit line 312, the applied field is not sufficient to tunnel carriers to the floating gate/node, no data value is programmed and the selected memory cell 322 remains in the erased state.

For example, in the programming operation detailed in FIG. 3A, a program voltage (Vpgm=20V) 324 is placed on the word line 306 coupled to the control gate of the selected memory cell of WL2 322. A channel is generated in the string 320, by the application of a pass voltage (Vpass=9V) 326 to the word lines 306 coupled to the control gates of the drain-side unselected memory cells 302 of the string 320. The memory cell coupled to WL1 has a cutoff voltage (such as 0V, Vss, or ground) 336 applied to its gate to place it in cutoff and an elevated pass voltage (Vpass_WL0_high=10V-12V) 338 is applied to WL0 to boost the voltage at the source of the blocking cell of WL1 and enhance cutoff in it and the select gate 304 coupled to the source line 314. The select gate 304 coupling the memory string 320 to the source line 314 is turned off to isolate the string 320 from the source line 314 by the application of 0V 330 to the source select gate control line 308 and Vcc 334 to the source line 314. The memory string 320 is coupled to the bit line 312 through the drain select gate 304 by the application of Vcc 328 to the select gate drain control line 310 and the selected memory cell 322 is then programmed to a logical "0" state by the application of 0V 332 to the bit line 312.

In programming higher numbered word lines in the memory string 320 of FIG. 3A, the memory cells 302 on the source line 314 side of the memory cell selected for programming 322 are divided into two groups. In the first group, one or more of the memory cells 302 directly adjacent the source line 314 side of the memory cell selected for programming 322 are selected as blocking cells and have a ground or Vss potential placed on their word lines 306 to place them in cutoff mode. In the second group, one or more of the remaining memory cells 302 on the source line 314 side of the memory cell selected for programming, that have not been selected to be blocking cells, have an elevated pass voltage applied to them to form a high channel voltage boost through capacitive coupling and boost the voltage at the source of the last blocking cell. This enhances cutoff in the blocking cells and the select gate 304 coupled to the source line 314. Alternatively, in the second group of memory cells, only the memory cell directly adjacent to the blocking cells of the first group has the elevated Vpass_high voltage applied to its word line. The remaining memory cells of the second group will have a conventional pass voltage or a lower alternative pass voltage, such as a read operation voltage Vpass_read or Vselect_read applied to their word lines.

Figure 3B:
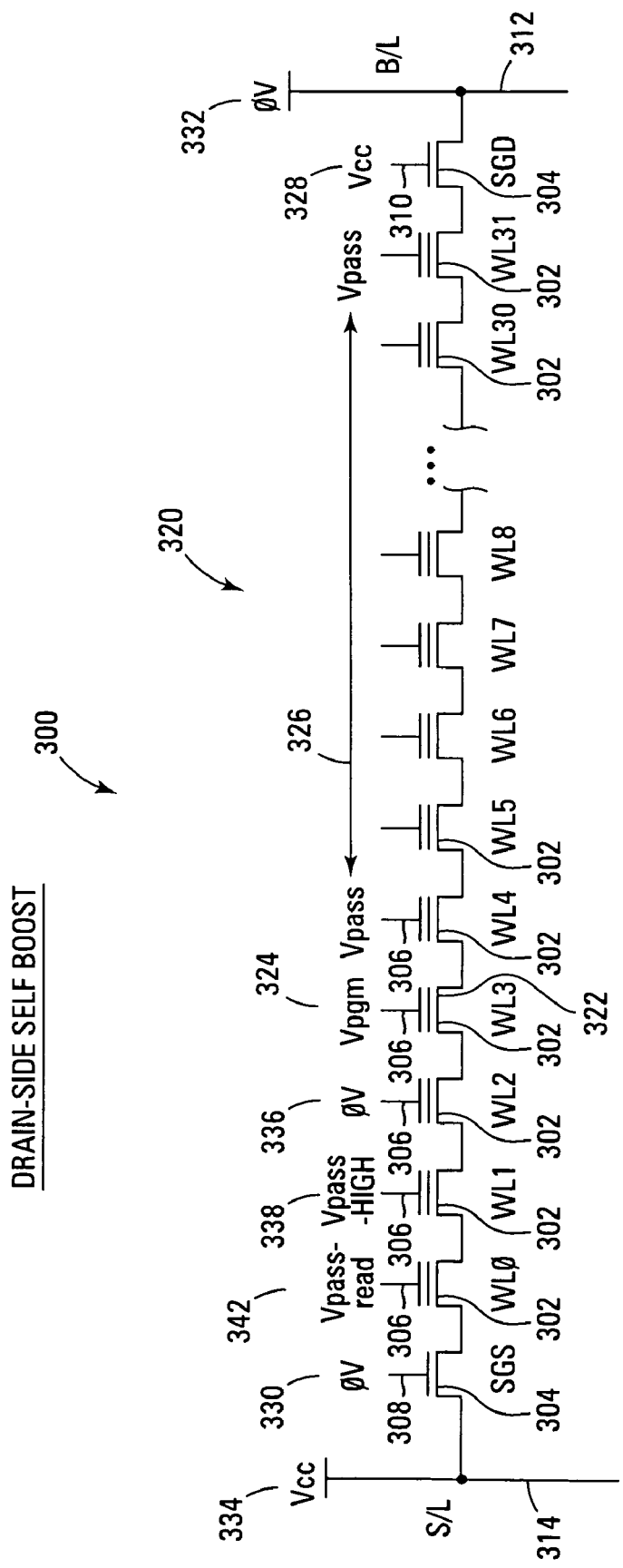
Figure 3C:
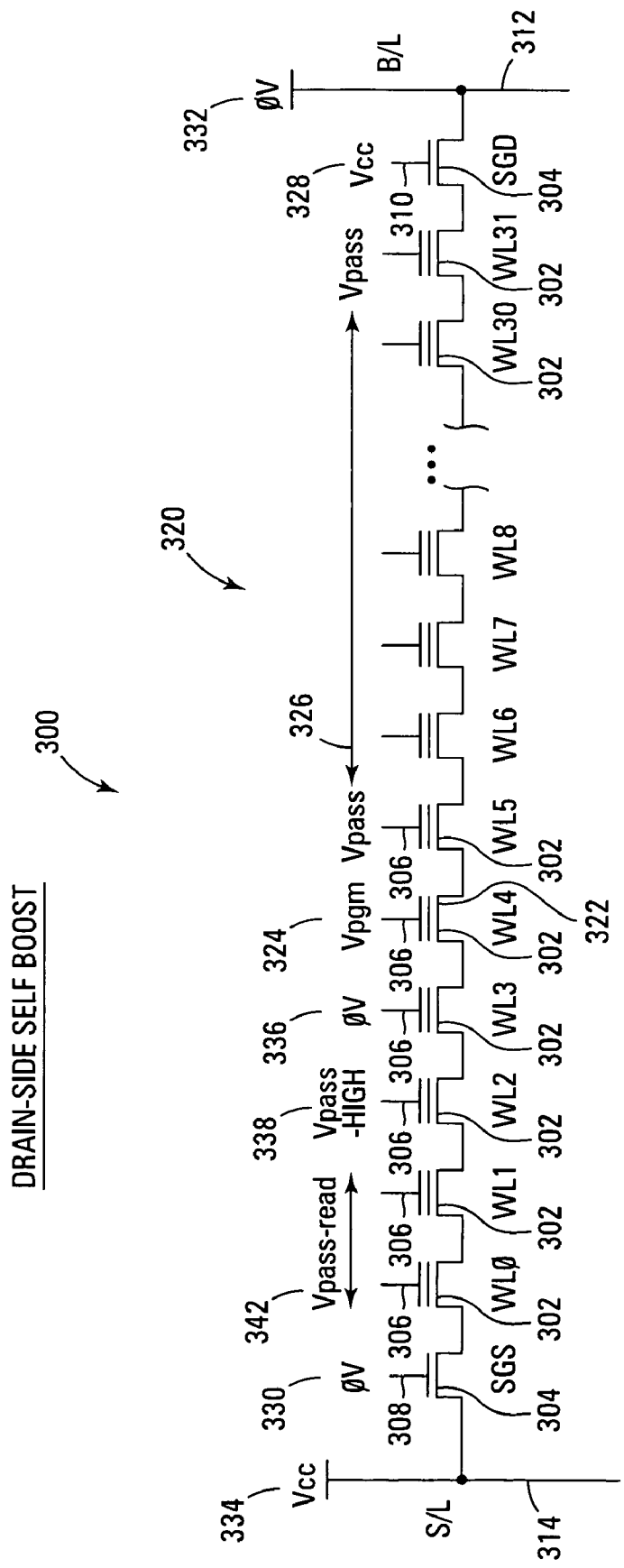

One example of programming higher numbered word lines in the memory string 320 is detailed in FIGS. 3B and 3C. In FIG. 3B, a program voltage (Vpgm) 324 is placed on the word line 306 coupled to the control gate of the selected memory cell of WL3 322. A channel is generated in the string 320, by the application of a pass voltage (Vpass) 326 to the word lines 306 coupled to the control gates of the drain-side unselected memory cells 302 of the string 320. The memory cell coupled to WL2 has a cutoff voltage (such as 0V, Vss, or ground) 336 applied to its gate to place it in cutoff and an elevated pass voltage (Vpass_high) 338 is applied to WL1 to boost the voltage at the source of the blocking cell of WL2. A lower voltage, such as Vpass_read (the typical read pass voltage for the memory device) or Vselect_read (the voltage applied to a memory cell selected for reading) 342 is applied to the remaining source-side memory cell coupled to WL0. In FIG. 3C, a program voltage (Vpgm) 324 is placed on the word line 306 coupled to the control gate of the selected memory cell of WL4 322. A channel is generated in the string 320, by the application of a pass voltage (Vpass) 326 to the word lines 306 coupled to the control gates of the drain-side unselected memory cells 302 of the string 320. The memory cell coupled to WL3 has a cutoff voltage (such as 0V, Vss, or ground) 336 applied to its gate to place it in cutoff and an elevated pass voltage (Vpass_high) 338 is applied to WL2 to boost the voltage at the source of the blocking cell of WL3. A lower voltage, such as Vpass_read (the typical read pass voltage for the memory device) or Vselect_read (the voltage applied to a memory cell selected for reading) 342 is applied to the remaining source-side memory cells coupled to WL0 and WL1.

It is noted that the programming operation and voltage levels of FIGS. 3A-3C are for illustrative purposes and should not be taken as limiting.

Figure 3D:
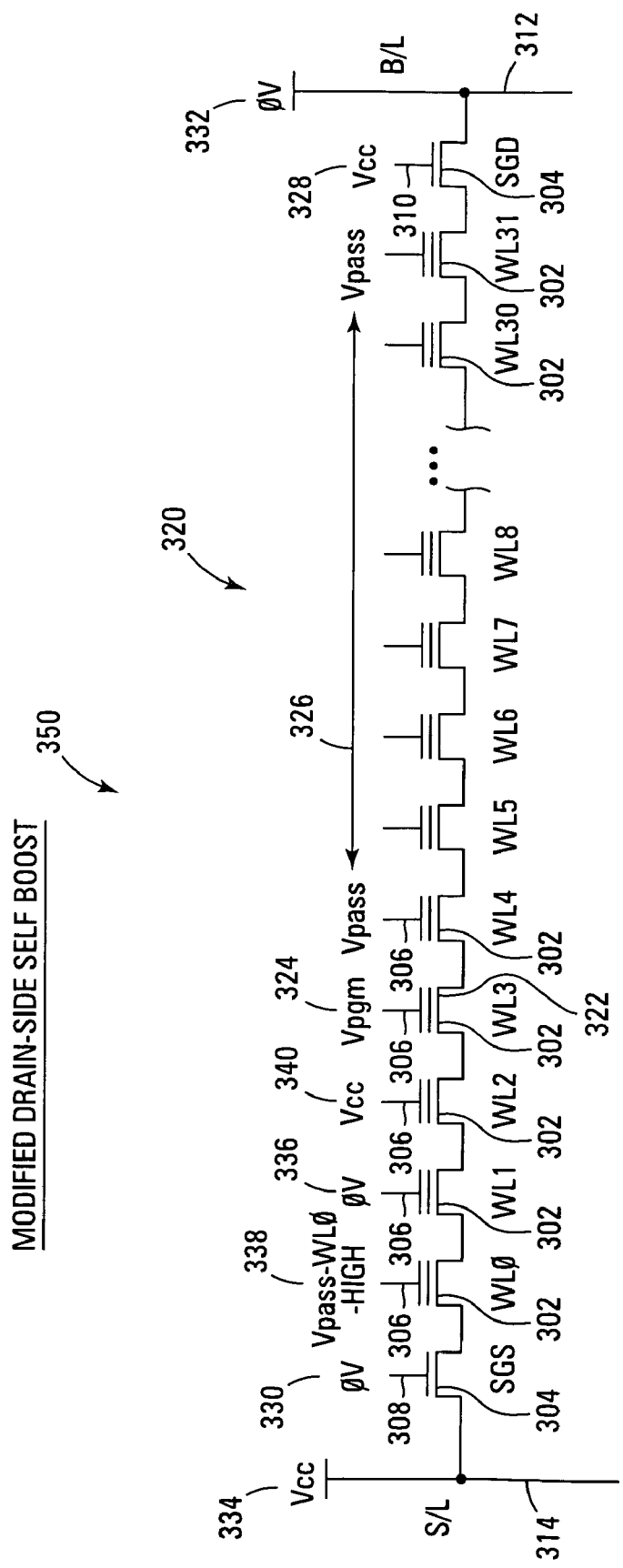

FIG. 3D illustrates a NAND architecture memory 350 embodiment of the present invention that applies an elevated pass voltage during a modified drain-side self boost programming operation. In FIG. 3D, the memory cell 322 coupled to the WL3 306 of the memory string 320 has been selected for programming and an elevated programming voltage 324 is applied to it. Word line/memory cell 302 coupled to WL2, directly adjacent the memory cell/WL3 selected for programming 322, is coupled to an intermediate voltage 340, such as Vcc or Vdd, to decrease the maximum word line to word line voltage differential of the programming operation. The memory cell coupled to WL1 acts as the blocking cell for the modified drain-side self boost and has a ground or 0V potential 336 applied to its gate. In addition, an elevated pass voltage (Vpass_WL0_high) 338 is applied to WL0 during the programming operation to boost the voltage at the source of the blocking cell of WL1 and enhance cutoff in the blocking cell and the select gate 304 coupled to the source line 314. The word lines 306 that are coupled to the gates of the unselected memory cells 302 of the string 320 towards the bit line 312 are driven by a pass voltage (Vpass) 326 so as to operate them as pass transistors, generating a channel of carriers in the unselected memory cells 302. The memory string 320 is then coupled to a bit line 312 that has a program or program-inhibit voltage placed upon it, through the generated drain-side channel of the string 320 and select gate 304.

In programming higher numbered word lines in the memory string 320 of FIG. 3D, the memory cells 302 on the source line 314 side of the memory cell selected for programming 322, not including the most directly adjacent source line side memory cell 302, are divided into two groups, as in the drain-side self boost of FIG. 3A. The most directly adjacent source line side memory cell 302 has an intermediate voltage applied to its word line 306. In the first group, one or more of the memory cells 302 directly adjacent the most directly adjacent source line side memory cell 302 are selected as blocking cells and have a ground or Vss potential placed on their word lines 306 to place them in cutoff mode. In the second group, one or more of the remaining memory cells 302 on the source line 314 side of the memory cell selected for programming, that have not been selected to be blocking cells and are not the most directly adjacent source line side memory cell 302, have an elevated pass voltage applied to them to form a high channel voltage boost through capacitive coupling and boost the voltage at the source of the last blocking cell. This enhances cutoff in the blocking cells and the select gate 304 coupled to the source line 314. Alternatively, the remaining memory cells of the second group will have a conventional pass voltage or a lower alternative pass voltage, such as a read operation voltage Vpass_read or Vselect_read applied to their word lines.

Figure 3E:
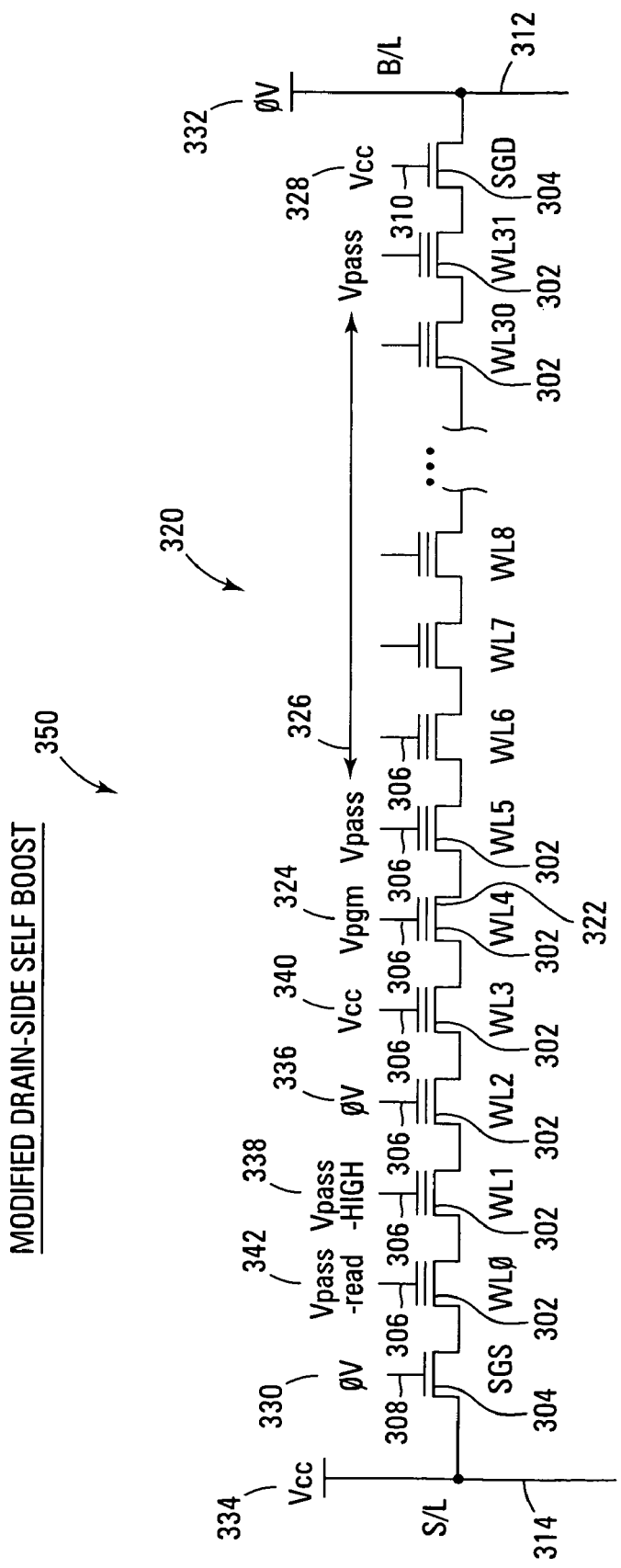
Figure 3F:
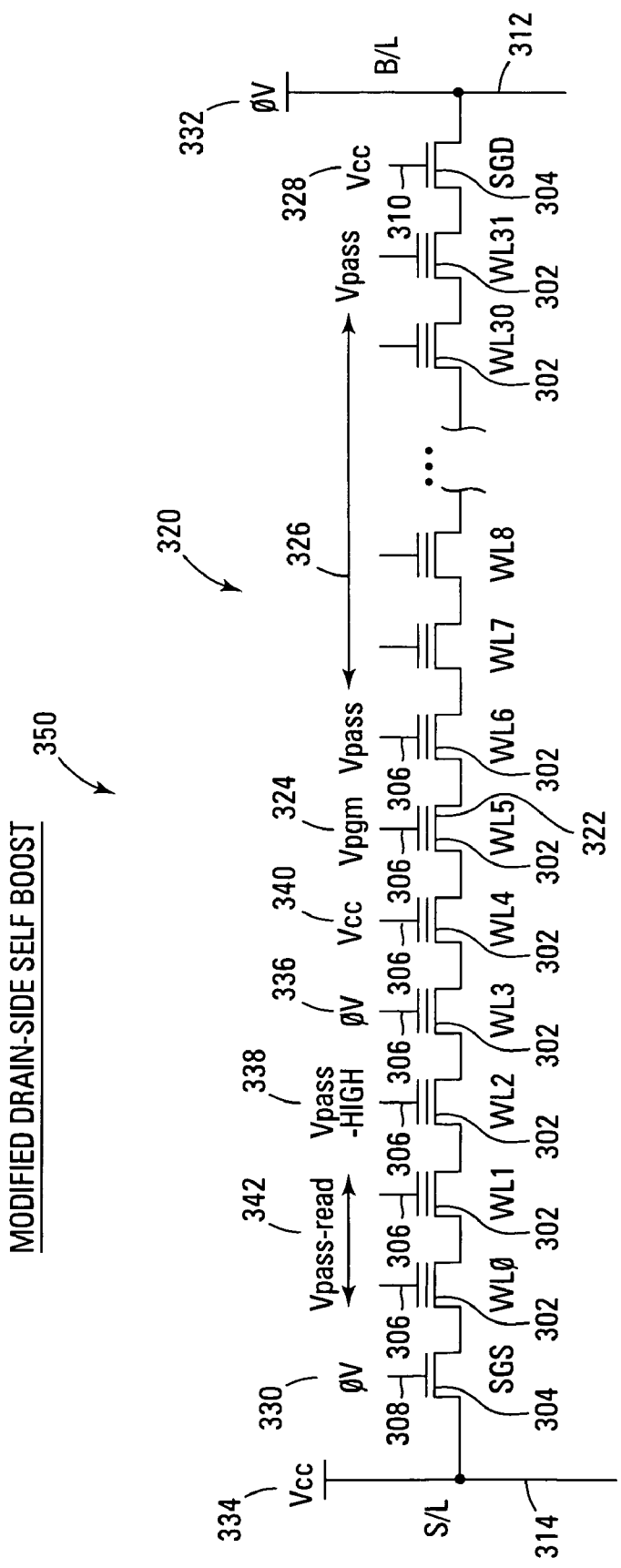

One example of programming higher numbered word lines in the memory string 320 is detailed in FIGS. 3E and 3F. In FIG. 3E, a program voltage (Vpgm) 324 is placed on the word line 306 coupled to the control gate of the selected memory cell of WL4 322. A channel is generated in the string 320, by the application of a pass voltage (Vpass) 326 to the word lines 306 coupled to the control gates of the drain-side unselected memory cells 302 of the string 320. Word line/memory cell 302 coupled to WL3, directly adjacent the memory cell/WL4 selected for programming 322, is coupled to an intermediate voltage 340, such as Vcc or Vdd, to decrease the maximum word line to word line voltage differential of the programming operation. The memory cell coupled to WL2 has a cutoff voltage (such as 0V, Vss, or ground) 336 applied to its gate to place it in cutoff and an elevated pass voltage (Vpass_high) 338 is applied to WL1 to boost the voltage at the source of the blocking cell of WL2. A lower voltage, such as Vpass_read (the typical read pass voltage for the memory device) or Vselect_read (the voltage applied to a memory cell selected for reading) 342 is applied to the remaining source-side memory cell coupled to WL0. In FIG. 3F, a program voltage (Vpgm) 324 is placed on the word line 306 coupled to the control gate of the selected memory cell of WL5 322. A channel is generated in the string 320, by the application of a pass voltage (Vpass) 326 to the word lines 306 coupled to the control gates of the drain-side unselected memory cells 302 of the string 320. Word line/memory cell 302 coupled to WL4, directly adjacent the memory cell/WL5 selected for programming 322, is coupled to an intermediate voltage 340, such as Vcc or Vdd, to decrease the maximum word line to word line voltage differential of the programming operation. The memory cell coupled to WL3 has a cutoff voltage (such as 0V, Vss, or ground) 336 applied to its gate to place it in cutoff and an elevated pass voltage (Vpass_high) 338 is applied to WL2 to boost the voltage at the source of the blocking cell of WL3. A lower voltage, such as Vpass_read (the typical read pass voltage for the memory device) or Vselect_read (the voltage applied to a memory cell selected for reading) 342 is applied to the remaining source-side memory cells coupled to WL0 and WL1.

In a local self boost embodiment, a second blocking cell would be positioned on opposite side of the selected memory cell 322 from the first blocking cell 336 and the applied word line voltages stepped from Vpgm 324 to cutoff voltage 0V 336 and back up to Vpass 326 in a mirror image of the applied word line voltages applied from the selected memory cell 322 to the first blocking cell 336.

In an example local self boost programming operation, Vpgm 324 is 20V and the blocking cell 336 is placed one or two (in the modified version) word lines downstream from the selected word line and the intervening word line voltages selected and stepped from Vpgm =20V 324 to 0V 336 at the blocking cell 336. Once past the blocking cell 336, the applied word line voltage is then stepped back up to Vpass_WL0_high=10V-12V 338. On the opposite side of the selected word line 322 from the source line 314, the word line voltage is stepped from Vpgm=20V 324 to 0V 336, to the final standard unselected word line pass voltage (Vpass) of 9V 326.

It is noted that other voltages and step sizes may be used in drain-side self boost, modified drain-side self boost and local self boost programming operations.

Figure 4:
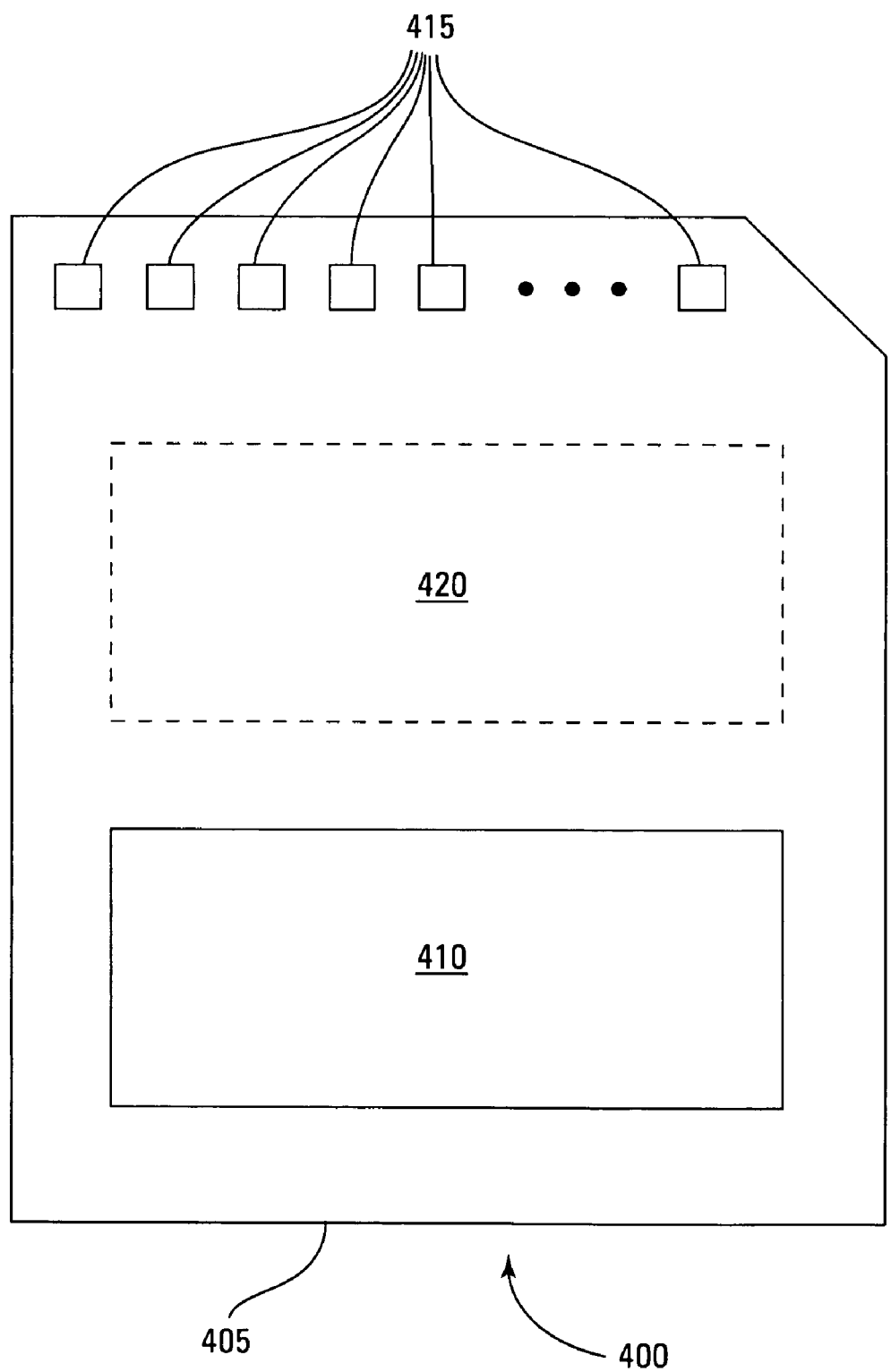
FIG. 4 is a simplified block diagram of a memory module in accordance with an embodiment of the present invention.

FIG. 4 is an illustration of an exemplary memory module 400. Memory module 400 is illustrated as a memory card, although the concepts discussed with reference to memory module 400 are applicable to other types of removable or portable memory, e.g., USB flash drives, and are intended to be within the scope of "memory module" as used herein. In addition, although one example form factor is depicted in FIG. 4, these concepts are applicable to other form factors as well.

In some embodiments, memory module 400 will include a housing 405 (as depicted) to enclose one or more memory devices 410, though such a housing is not essential to all devices or device applications. At least one memory device 410 is a non-volatile memory including circuits of or adapted to perform elements of methods of the present invention. Where present, the housing 405 includes one or more contacts 415 for communication with a host device. Examples of host devices include digital cameras, digital recording and playback devices, PDAs, personal computers, memory card readers, interface hubs and the like. For some embodiments, the contacts 415 are in the form of a standardized interface. For example, with a USB flash drive, the contacts 415 might be in the form of a USB Type-A male connector. For some embodiments, the contacts 415 are in the form of a semi-proprietary interface, such as might be found on CompactFlash™ memory cards licensed by SanDisk Corporation, Memory Stick™ memory cards licensed by Sony Corporation, SD Secure Digital™ memory cards licensed by Toshiba Corporation and the like. In general, however, contacts 415 provide an interface for passing control, address and/or data signals between the memory module 400 and a host having compatible receptors for the contacts 415.

The memory module 400 may optionally include additional circuitry 420 which may be one or more integrated circuits and/or discrete components. For some embodiments, the additional circuitry 420 may include a memory controller for controlling access across multiple memory devices 410 and/or for providing a translation layer between an external host and a memory device 410. For example, there may not be a one-to-one correspondence between the number of contacts 415 and a number of I/O connections to the one or more memory devices 410. Thus, a memory controller could selectively couple an I/O connection (not shown in FIG. 4) of a memory device 410 to receive the appropriate signal at the appropriate I/O connection at the appropriate time or to provide the appropriate signal at the appropriate contact 415 at the appropriate time. Similarly, the communication protocol between a host and the memory module 400 may be different than what is required for access of a memory device 410. A memory controller could then translate the command sequences received from a host into the appropriate command sequences to achieve the desired access to the memory device 410. Such translation may further include changes in signal voltage levels in addition to command sequences.

The additional circuitry 420 may further include functionality unrelated to control of a memory device 410 such as logic functions as might be performed by an ASIC (application specific integrated circuit). Also, the additional circuitry 420 may include circuitry to restrict read or write access to the memory module 400, such as password protection, biometrics or the like. The additional circuitry 420 may include circuitry to indicate a status of the memory module 400. For example, the additional circuitry 420 may include functionality to determine whether power is being supplied to the memory module 400 and whether the memory module 400 is currently being accessed, and to display an indication of its status, such as a solid light while powered and a flashing light while being accessed. The additional circuitry 420 may further include passive devices, such as decoupling capacitors to help regulate power requirements within the memory module 400.

It is noted that other programming operations and voltage levels for non-volatile memory device and array embodiments of the present invention are possible and will be apparent for those skilled in the art with the benefit of this disclosure.

CONCLUSION

A NAND architecture non-volatile memory device and programming process has been described that programs the various cells of strings of non-volatile memory cells utilizing a drain-side self boost, modified drain-side self boost or local self boost process that increases the pass voltage (Vpass_high) on a word line on the source line side of a memory cells selected for programming to boost the voltage on the source of the adjacent blocking cell of the string. This drives the adjacent blocking cell further into cutoff and increases boosting by decreasing channel leakage to the source line during programming.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of programming a non-volatile NAND architecture memory string, comprising:
    applying a program voltage to a selected word line coupled to a non-volatile memory cell of the NAND architecture memory string that is selected for programming;
    applying a cutoff voltage to a first set of one or more source-side word lines, wherein the first set of source-side word lines are between the selected word line and a source line;
    applying an elevated pass voltage to a second set of one or more source-side word lines between the first set source-side word lines and the source line, wherein the elevated pass voltage is higher in potential than a first pass voltage applied to a drain-side word line of the string, wherein the drain-side word line is between the selected word line and a bit line; and
    applying a second pass voltage to a third set of one or more source-side word lines between the second set of source-side word lines and the source line, wherein the first pass voltage is greater than the second pass voltage.

2. The method of claim 1, wherein the second pass voltage is one of a read pass voltage (Vpass_read) and a read select voltage (Vselect_read).

3. The method of claim 1, further comprising:
    applying the first pass voltage to a first set of one or more drain-side word lines of the string, wherein the first set of drain-side word lines are between the selected word line and the bit line.

4. The method of claim 3 further comprising applying the cutoff voltage to a second set of one or more drain-side word lines, wherein the second set of drain-side word lines are between the selected word line and the bit line and are adjacent to the selected word line.

5. The method of claim 1, wherein the method of programming is one of a drain-side self boost programming operation, a modified drain-side self boost programming operation, and a local self boost programming operation.

6. The method of claim 5, further comprising applying an intermediate voltage to a word line between the selected word line and the first set of source-side word lines, wherein the intermediate voltage is between the program voltage and the cutoff voltage.

7. method of claim 1, wherein the non-volatile memory cell is one of a floating gate memory cell, a multi-level cell (MLC), and a non-conductive floating node memory cell.

8. A method of operating a NAND architecture memory device, comprising:
    applying a program voltage to a selected word line coupled to a memory cell of a NAND architecture memory string that is selected for programming in a NAND architecture non-volatile memory array of the memory device;
    applying a first pass voltage to a first set of one or more unselected word lines of the string, wherein the first set of one or more unselected word lines are between the selected word line and a bit line;
    applying a cutoff voltage to a second set of one or more unselected word lines, wherein the second set of one or more unselected word lines are between the selected word line and a source line;
    applying a second pass voltage to a third set of one or more unselected word lines, wherein the third set of one or more unselected word lines are between the second set of one or more unselected word lines and the source line, and where the second pass voltage is between the first pass voltage and the program voltage; and
    applying a third pass voltage to a fourth set of one or more unselected word lines, wherein the fourth set of one or more unselected word lines are between the third set of one or more unselected word lines and the source line, and where the first pass voltage is greater than the third pass voltage.

9. The method of claim 8, wherein the method of programming is one of a drain-side self boost programming operation and a local self boost programming operation.

10. The method of claim 9, further comprising applying the cutoff voltage to a word line between the selected word line and the first set of one or more word lines.

11. The method of claim 8, wherein the non-volatile memory cell is one of a floating gate memory cell, a multi-level cell (MLC), and a non-conductive floating node memory cell.

12. The method of claim 8, wherein the method of programming is one of a modified drain-side self boost programming operation and a modified local self boost programming operation.

13. The method of claim 12, further comprises further comprising applying an intermediate voltage to a first drain-side word line between the selected word line and the first set of one or more unselected word lines and applying a cutoff voltage to a second drain-side word line between the first drain-side word line and the first set of one or more unselected word lines.

14. A non-volatile NAND architecture memory device comprising:
    a NAND architecture non-volatile memory array having a plurality of memory blocks; and
    a control circuit, wherein the control circuit is configured to program memory cells in a selected memory block of the non-volatile memory array by,
        applying a program voltage to a selected word line coupled to a memory cell of a NAND architecture memory string,
        applying a first pass voltage to a first set of one or more unselected word lines of the string, wherein the first set of one or more unselected word lines are between the selected word line and a bit line, applying a cutoff voltage to a second set of one or more unselected word lines, wherein the second set of one or more unselected word lines are between the selected word line and a source line and are adjacent to the selected word line, applying a second pass voltage to a third set of one or more unselected word lines, wherein the third set of one or more unselected word lines are between the second set of one or more unselected word lines and the source line wherein the second pass voltage is between the first pass voltage and the program voltage, and applying a third pass voltage to a fourth set of one or more unselected word lines, wherein the fourth set of one or more unselected word lines are between the third set of one or more unselected word lines and the source line, and where the third pass voltage is between the first pass voltage and a ground potential.

15. The non-volatile NAND architecture memory device of claim 14, wherein the third pass voltage is one of a read pass voltage (Vpass_read) and a read select voltage (Vselect_read).

16. The non-volatile NAND architecture memory device of claim 14, wherein the control circuit is configured to program memory cells by one of a drain-side self boost programming operation, a modified drain-side self boost programming operation, and a local self boost programming operation.

17. The non-volatile NAND architecture memory device of claim 14, wherein the method of programming is a local self boost programming operation and the control circuit is configured to apply the cutoff voltage to a fourth set of one or more unselected word lines, wherein the fourth set of one or more unselected word lines are between the first set of one or more unselected word lines and the selected word line.

18. The non-volatile NAND architecture memory device of claim 14, wherein the memory cells are one of floating gate memory cells, multi-level cells (MLCs), and non-conductive floating node memory cells.

19. A non-volatile NAND architecture memory device comprising:
a NAND architecture non-volatile memory array having a plurality of memory blocks; and
a control circuit, wherein the control circuit is configured to program memory cells in a selected memory block of the non-volatile memory array by,
applying a program voltage to a selected word line coupled to a memory cell of a NAND architecture memory string,
applying a first pass voltage to a first set of one or more unselected word lines of the string, wherein the first set of one or more unselected word lines are between the selected word line and a bit line,
applying an intermediate voltage to a second set of one or more unselected word lines, wherein the second set of one or more unselected word lines are between the selected word line and a source line and are adjacent to the selected word line, and where the intermediate voltage is between a cutoff voltage and the program voltage,
applying the cutoff voltage to a third set of one or more unselected word lines, wherein the third set of one or more unselected word lines are between the second set of one or more unselected word lines and the source line,
applying a second pass voltage to a fourth set of one or more unselected word lines, wherein the fourth set of one or more unselected word lines are between the third set of one or more unselected word lines and the source line, and where the second pass voltage is between the first pass voltage and the program voltage, and applying a third pass voltage to a fifth set of one or more unselected word lines, wherein the fifth set of one or more unselected word lines are between the fourth set of one or more unselected word lines and the source line, and where the first pass voltage is greater than the third pass voltage.

20. The non-volatile NAND architecture memory device of claim 19, wherein the control circuit is configured to program memory cells by one of a drain-side self boost programming operation, a modified drain-side self boost programming operation, and a local self boost programming operation.

21. The non-volatile NAND architecture memory device of claim 19, wherein the method of programming is a modified local self boost programming operation and where the control circuit is adapted configured to,
apply the intermediate voltage to a sixth set of one or more unselected word lines, wherein the sixth set of one or more unselected word lines are between the selected word line and the bit line and are adjacent to the selected word line, and
apply the cutoff voltage to a seventh set of one or more unselected word lines, wherein the seventh set of one or more unselected word lines are between the sixth set of one or more unselected word lines and the first set of one or more unselected word lines.

22. The non-volatile NAND architecture memory device of claim 19, wherein the memory cells are one of floating gate memory cells, multi-level cells (MLCs), and non-conductive floating node memory cells.

23. A system comprising:
a host coupled to a non-volatile memory device, wherein the non-volatile memory device comprises,
a NAND architecture non-volatile memory array having a plurality of blocks;
wherein the system is configured to program memory cells in a selected block of the non-volatile memory array by,
applying a program voltage to a selected word line coupled to a non-volatile memory cell of a NAND architecture memory string of the array that is selected for programming;
applying a first pass voltage to a set of one or more drain-side word lines of the string, wherein the set of one or more drain-side word lines are between the selected word line and a bit line;
applying a cutoff voltage to a first set of one or more source-side word lines, wherein the first set of one or more source-side word lines are between the selected word line and a source line and are adjacent to the selected word line;
applying an elevated pass voltage to a second set of one or more source-side word lines between the first set of one or more source-side word lines and the source line, wherein the elevated pass voltage is higher in potential than the first pass voltage; and
applying a second pass voltage to a third set of one or more source-side word lines between the second set of one or more source-side word lines and the source line, wherein the first pass voltage is greater than the second pass voltage.

24. The system of claim 23, wherein the host is one of a processor and a memory controller.

25. The system of claim 23, wherein the system is configured to program memory cells by one of a drain-side self boost programming operation, a modified drain-side self boost programming operation, and a local self boost programming operation.

26. A memory module, comprising:
a plurality of contacts; and
two or more memory devices, each having access lines selectively coupled to the plurality of contacts;
wherein at least one of the memory device comprises:
a NAND architecture non-volatile memory array having a plurality of memory blocks,
wherein the memory module is configured to program memory cells in a selected block of the non-volatile memory array by,
applying a program voltage to a selected word line coupled to a memory cell of a NAND architecture memory string that is selected for programming in the NAND architecture non-volatile memory array,
applying a first pass voltage to a first set of one or more unselected word lines of the string, wherein the first set of one or more unselected word lines are between the selected word line and a bit line,
applying a cutoff voltage to a second unselected word line, wherein the second unselected word line is between the selected word line and a source line and is adjacent the selected word line,
applying a second pass voltage to a third unselected word line between the second unselected word line and the source line, wherein the second pass voltage is between the first pass voltage and the program voltage, and
applying a third pass voltage to a fourth unselected word line between the third unselected word line and the source line, wherein the third pass voltage is between the first pass voltage and a ground potential.

27. The memory module of claim 26, further comprising a memory controller coupled to the one or more memory devices for controlling operation of each memory device in response to the host system.

28. A memory module, comprising:
a housing having a plurality of contacts; and
one or more memory devices enclosed in the housing and selectively coupled to the plurality of contacts;
wherein the memory module is configured to program memory cells in a selected block of at least one of the memory devices by,
applying a program voltage to a selected word line coupled to a memory cell of a NAND architecture memory string that is selected for programming in a NAND architecture non-volatile memory array of the memory device,
applying a first pass voltage to a first set of one or more unselected word lines of the string, wherein the first set of one or more unselected word lines are between the selected word line and a bit line,
applying a cutoff voltage to a second unselected word line, wherein the second unselected word line is between the selected word line and a source line and is adjacent to the selected word line,
applying a second pass voltage to a third unselected word line between the second unselected word line and the source line, wherein the second pass voltage is between the first pass voltage and the program voltage, and
applying a third pass voltage to a fourth unselected word line between the third unselected word line and the source line, wherein the first pass voltage is greater than the third pass voltage.

29. A method of operating a NAND architecture memory device, comprising:
applying a program voltage to a selected word line coupled to a memory cell of a NAND architecture memory string that is selected for programming in a NAND architecture non-volatile memory array of the memory device;
applying a first pass voltage to a first set of one or more unselected word lines of the string, wherein the first set of one or more unselected word lines are between the selected word line and a bit line;
applying a cutoff voltage to a second unselected word line, wherein the second unselected word line is between the selected word line and a source line and is adjacent to the selected word line;
applying a second pass voltage to a third unselected word line between the second unselected word line and the source line, wherein the second pass voltage is between the first pass voltage and the program; and
applying a third pass voltage to a fourth unselected word line between the second unselected word line and the source line, wherein the first pass voltage is greater than the third pass voltage.

30. The method of claim 29, wherein the programming operation is one of a self boost programming operation, a drain-side self boost programming operation, and a local self boost programming operation.

* * * * *

UNITED STATES PATENT AND TRADEMARK OFFICE
CERTIFICATE OF CORRECTION

PATENT NO. : 7,525,841 B2
APPLICATION NO. : 11/452698
DATED : April 28, 2009
INVENTOR(S) : Aritome Page 1 of 1

It is certified that error appears in the above-identified patent and that said Letters Patent is hereby corrected as shown below:

In column 13, line 39, in Claim 1, after "set" insert -- of --.

In column 18, line 40, in Claim 29, delete "program;" and insert -- program voltage; --, therefor.

Signed and Sealed this

Fourteenth Day of July, 2009

JOHN DOLL
*Acting Director of the United States Patent and Trademark Office*